United States Patent
Tsai et al.

(10) Patent No.: US 12,199,403 B2
(45) Date of Patent: Jan. 14, 2025

(54) ELECTRONIC DEVICE

(71) Applicant: LITE-ON TECHNOLOGY CORPORATION, Taipei (TW)

(72) Inventors: Hsin-Wei Tsai, Kaohsiung (TW); Shu-Hua Yang, Taichung (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 709 days.

(21) Appl. No.: 17/492,758

(22) Filed: Oct. 4, 2021

(65) Prior Publication Data

US 2022/0115837 A1 Apr. 14, 2022

Related U.S. Application Data

(60) Provisional application No. 63/089,296, filed on Oct. 8, 2020.

(30) Foreign Application Priority Data

Aug. 11, 2021 (CN) .......................... 202110919154.0

(51) Int. Cl.
*H01S 5/02208* (2021.01)
*H01S 5/00* (2006.01)
(Continued)

(52) U.S. Cl.
CPC ........ *H01S 5/02257* (2021.01); *H01S 5/0014* (2013.01); *H01S 5/02218* (2021.01); *H01S 5/02208* (2013.01); *H01S 5/183* (2013.01)

(58) Field of Classification Search
CPC .. H01S 5/02208–02216; H01S 5/0225–02257; H01S 5/183–18397;
(Continued)

(56) References Cited

U.S. PATENT DOCUMENTS

| | | | |
|---|---|---|---|
| 2019/0146319 A1* | 5/2019 | Stapleton | H01S 5/02208 372/50.124 |
| 2019/0379173 A1* | 12/2019 | Coffy | H01S 3/034 |
| 2021/0217676 A1* | 7/2021 | Yeh | H01L 25/0655 |

FOREIGN PATENT DOCUMENTS

| | | |
|---|---|---|
| CN | 105060296 A | 11/2015 |
| CN | 107069420 A | 8/2017 |

(Continued)

*Primary Examiner* — Joshua King
*Assistant Examiner* — Fernanda Adriana Camacho Alanis
(74) *Attorney, Agent, or Firm* — Li & Cai Intellectual Property (USA) Office

(57) ABSTRACT

An electronic device is provided. The electronic device includes a substrate, a semiconductor unit, a wall, and a light-transmitting member. The semiconductor unit is mounted on the substrate. The wall is disposed on the substrate and surrounds the semiconductor unit. The wall includes two exterior wall components and two interior wall components. The two exterior wall components are spaced apart from each other, so that two gaps are formed between the two exterior wall components. The two gaps are in spatial communication with an installation area that is surrounded by the two exterior wall components. The two interior wall components are arranged in the installation area and spaced apart from each other. The two interior wall components correspond in position to the two gaps and respectively shade parts of the two gaps. The light-transmitting member is disposed on the wall and covered on the semiconductor unit.

17 Claims, 16 Drawing Sheets

(51) Int. Cl.
*H01S 5/02218* (2021.01)
*H01S 5/02257* (2021.01)
*H01S 5/183* (2006.01)

(58) Field of Classification Search
CPC ....... H01L 27/00–156; H01L 25/00–50; H01L 23/12–18; H01L 31/00–208; H01L 33/00–648
See application file for complete search history.

(56) References Cited

FOREIGN PATENT DOCUMENTS

| | | | |
|---|---|---|---|
| CN | 208723309 U | 4/2019 | |
| CN | 209592080 U | 11/2019 | |
| CN | 110829170 A | 2/2020 | |
| DE | 102016102327 A1 | 8/2017 | |
| WO | WO-2020216032 A1 * | 10/2020 | ......... H01S 5/02253 |

* cited by examiner

ELECTRONIC DEVICE

CROSS-REFERENCE TO RELATED PATENT APPLICATION

This application claims the benefit of priority to China Patent Application No. 202110919154.0, filed on Aug. 11, 2021 in People's Republic of China. The entire content of the above identified application is incorporated herein by reference.

This application claims priority to the U.S. Provisional patent Application Ser. No. 63/089,296 filed on Oct. 8, 2020, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronic device, and more particularly to an electronic device that is configured to be ensured to be in an unsealed state and have an effect of blocking pollution.

BACKGROUND OF THE DISCLOSURE

In order to ensure that a gas can circulate between an internal space and an external space of a conventional electronic device, generally a gap is provided on an upper surface of the conventional electronic device. However, during a manufacturing process of the conventional electronic device, a fixing agent used to fix the components often inadvertently penetrates into and fills the gap, thereby causing the conventional electronic device to be in a sealed state.

SUMMARY OF THE DISCLOSURE

In response to the above-referenced technical inadequacy, the present disclosure provides an electronic device to effectively improve on the issues associated with conventional electronic devices.

In one aspect, the present disclosure provides an electronic device. The electronic device includes a substrate, a semiconductor unit, a wall, and a light-transmitting member. The semiconductor unit is mounted on the substrate. The wall is disposed on the substrate and surrounds the semiconductor unit. The wall includes two exterior wall components and two interior wall components. The two exterior wall components are spaced apart from each other, so that two gaps are formed between the two exterior wall components. The two gaps are in spatial communication with an installation area that is surrounded by the two exterior wall components. The two interior wall components are arranged in the installation area and spaced apart from each other. The two interior wall components correspond in position to the two gaps and respectively shade parts of the two gaps. The light-transmitting member is disposed on the wall and covered on the semiconductor unit.

In certain embodiments, the semiconductor unit is a light-emitting unit.

In certain embodiments, the light-transmitting member is supported by the two interior wall components.

In certain embodiments, each of the two interior wall components is made of metal material or covered by a metal layer on a surface thereof.

In certain embodiments, the light-transmitting member includes an inner detection circuit electrically coupled to the two interior wall components.

In certain embodiments, a part of each of the two exterior wall components is in a stepped shape, and includes a first step and a second step that is located on an inner side of the first step. A shortest distance between a top surface of the second step and the substrate is less than a shortest distance between a top surface of the first step and the substrate.

In certain embodiments, the light-transmitting member is supported by the second steps of the two interior wall components at a same time.

In certain embodiments, each of the two exterior wall components is made of metal material or covered by a metal layer on a surface thereof.

In certain embodiments, the light-transmitting member includes an outer detection circuit electrically coupled to the two exterior wall components.

In certain embodiments, the two interior wall components do not contact the two exterior wall components.

In certain embodiments, each of the two gaps has a minimum width that is within a range from 0.05 mm to 2 mm.

In certain embodiments, the electronic device further includes a detection unit mounted on the substrate.

Therefore, in the electronic device provided by the present disclosure, by virtue of "the two gaps being in spatial communication with the installation area that is surrounded by the two exterior wall components" and "the two interior wall components corresponding in position to the two gaps and respectively shading the parts of the two gaps", the electronic device can be ensured to be in an unsealed state and have an effect of blocking pollution.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
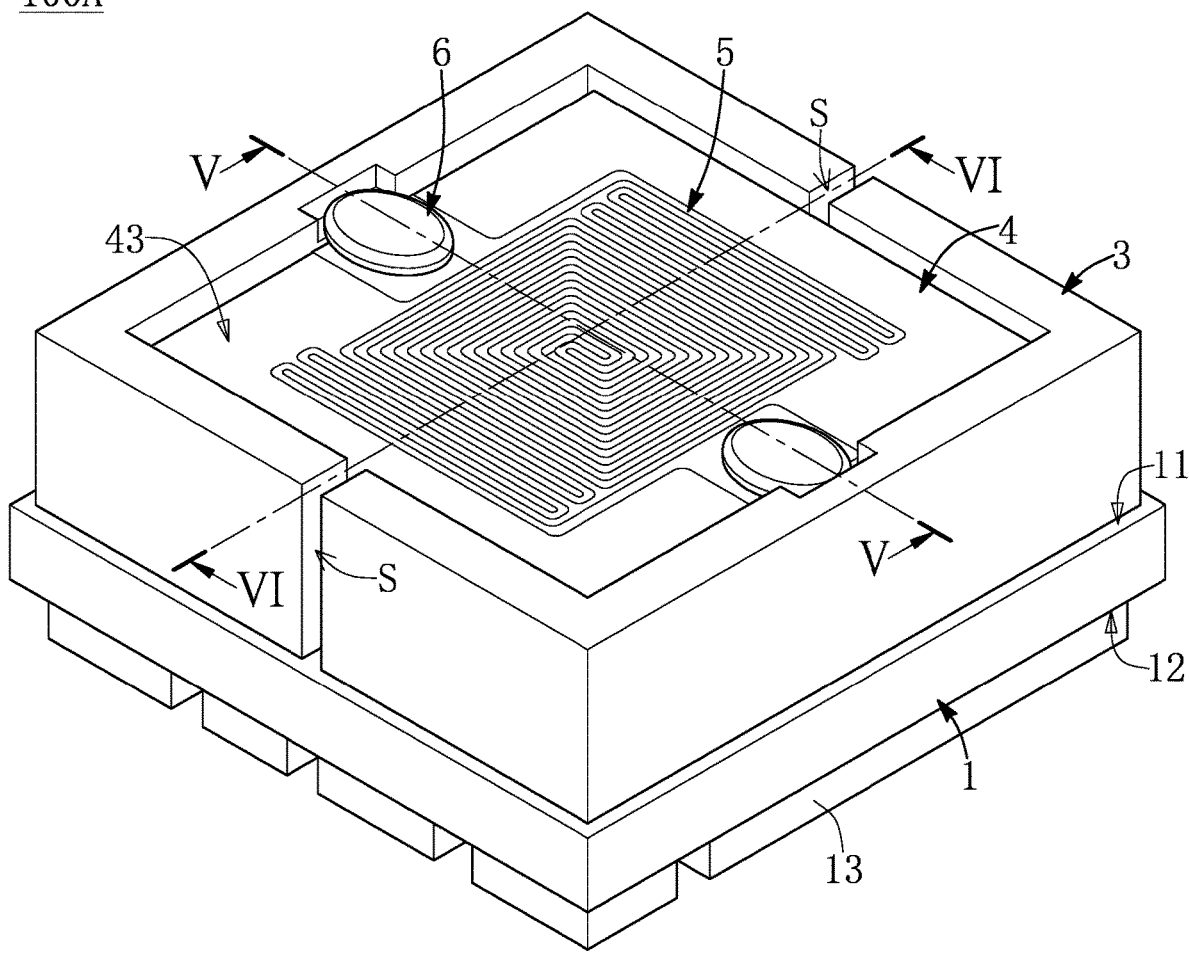
FIG. 1 is a schematic perspective view of an electronic device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
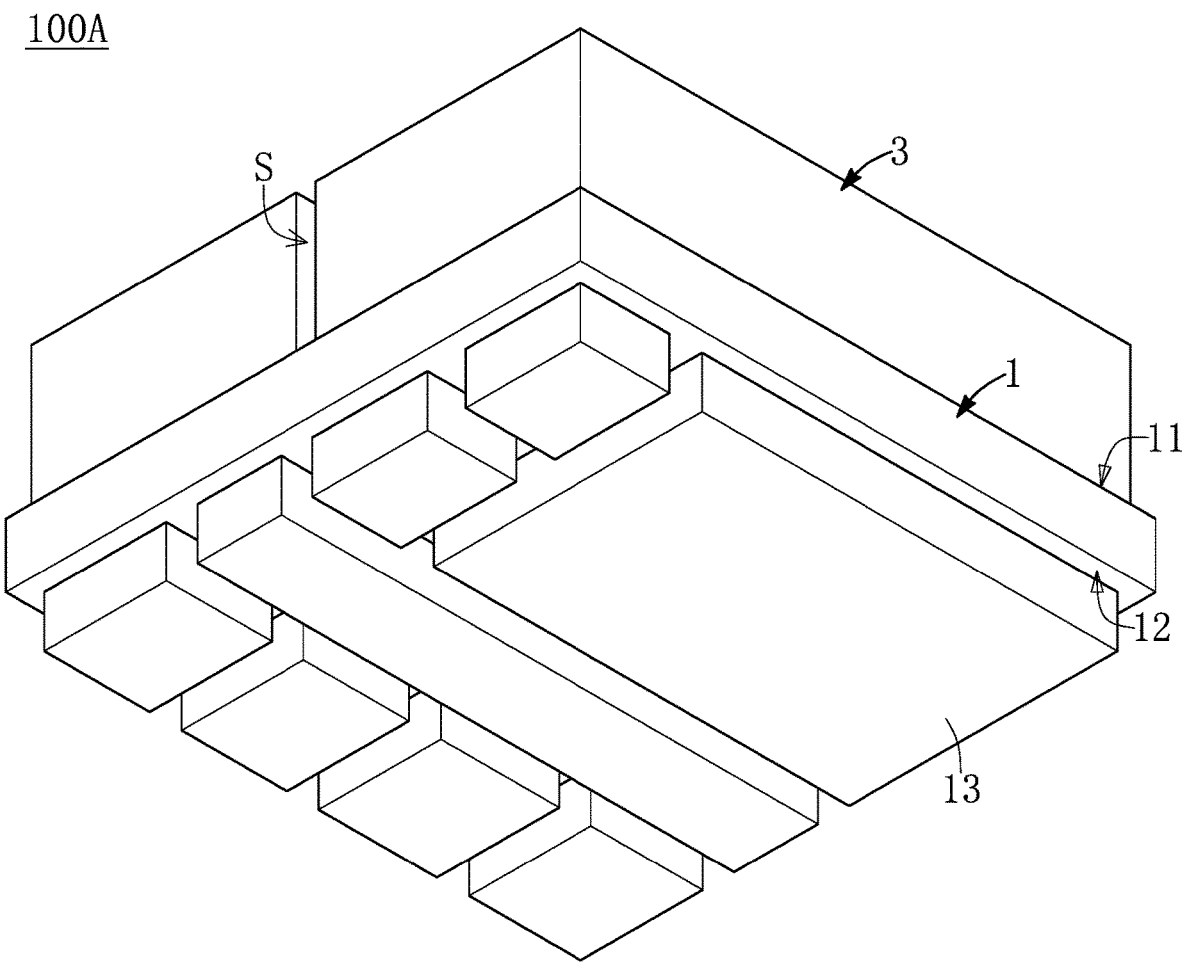
FIG. 2 is another schematic perspective view of the electronic device according to the first embodiment of the present disclosure.
Figure 3:
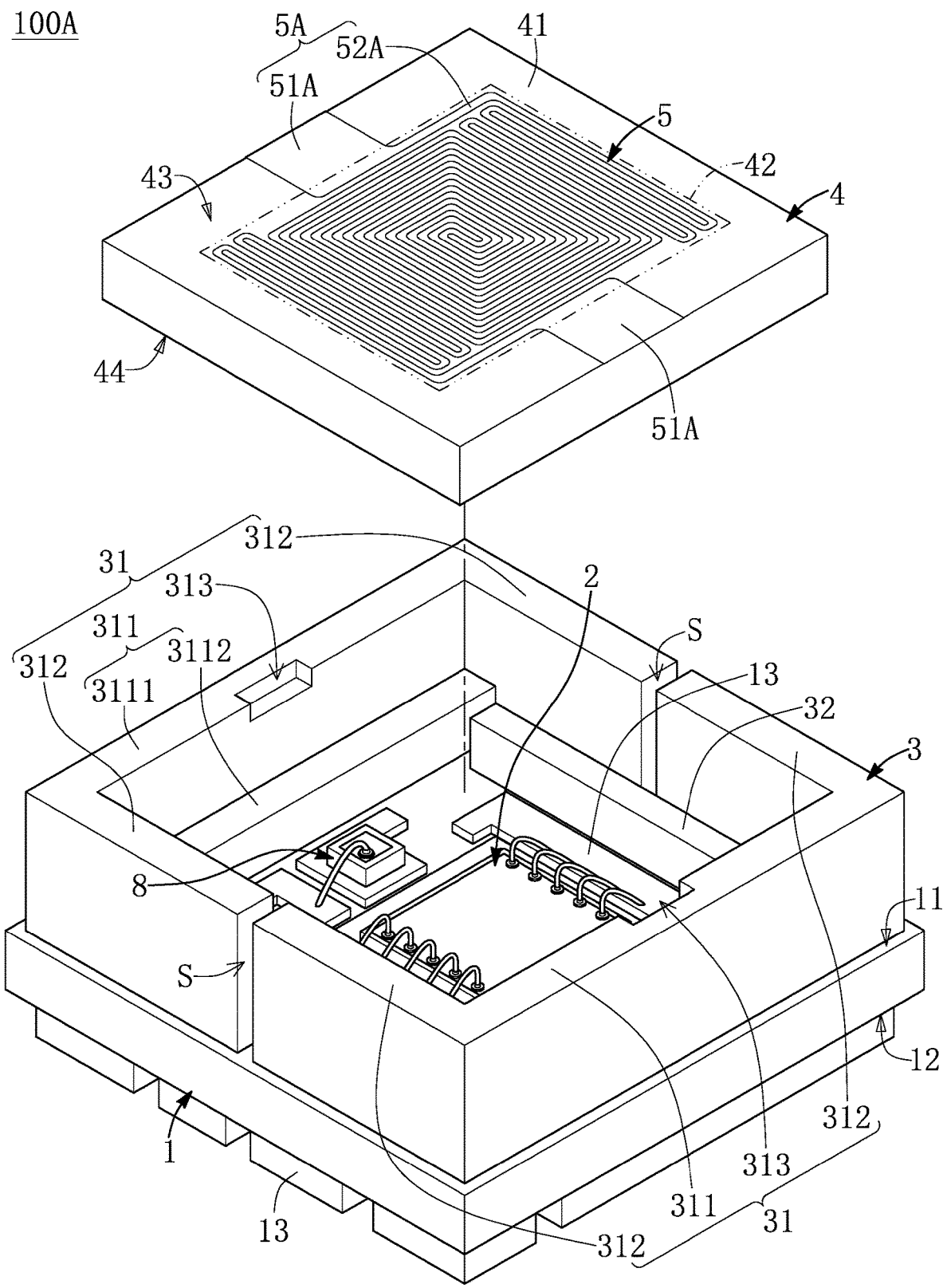
FIG. 3 is a schematic exploded view of the electronic device according to the first embodiment of the present disclosure.

Referring to FIG. 1 to FIG. 6, a first embodiment of the present disclosure provides an electronic device 100A. Referring to FIG. 1 to FIG. 3, the electronic device 100A includes a substrate 1, a semiconductor unit mounted on the substrate 1, a wall 3 disposed on the substrate 1 and surrounded the semiconductor unit, a light-transmitting member 4 disposed on the wall 3 and covered on the semiconductor unit, a detection circuit 5 formed on the light-transmitting member 4, and an electrically conductive agent 6 that can be electrically coupled to the detection circuit 5 and the wall 3. The following description describes the structure and connection relationship of each component of the electronic device 100A.

Referring to FIG. 1 to FIG. 3, the substrate 1 in the present embodiment is substantially in a rectangular shape (e.g., a square or a rectangle) and has a first surface 11 and a second surface 12 that is opposite to the first surface 11. The substrate 1 in the present embodiment is exemplified as a ceramic substrate, so as to have a better heat dissipation effect, but the present disclosure is not limited thereto.

Figure 4:
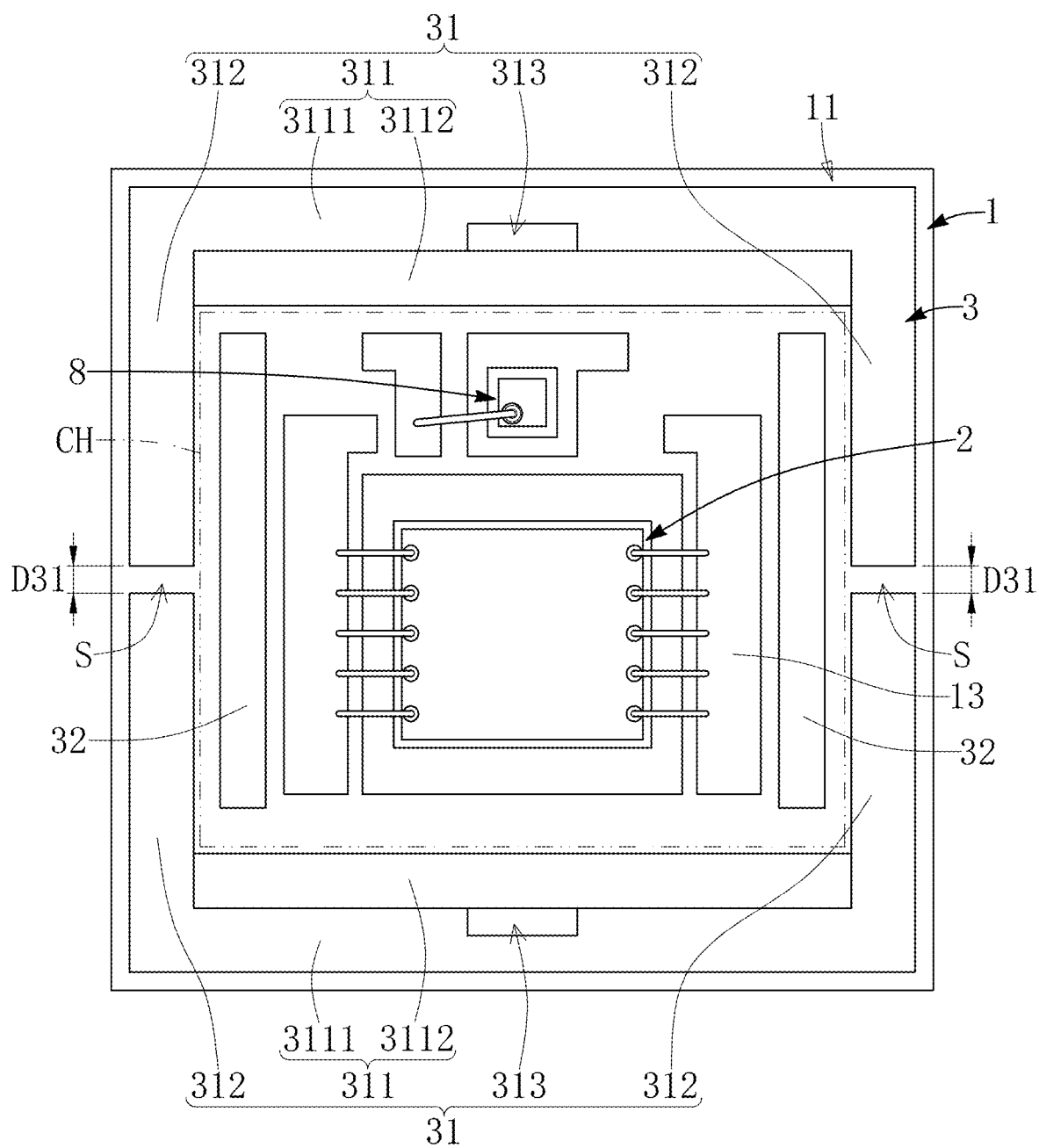
FIG. 4 is a top view of the electronic device provided without the light-transmitting member and the outer detection circuit according to the first embodiment of the present disclosure.

Referring to FIG. 3 and FIG. 4, the semiconductor unit in the present embodiment is a light-emitting unit 2 that is exemplified as a vertical-cavity surface-emitting laser (VCSEL), but the present disclosure is not limited thereto. For example, in certain embodiments of the present disclosure not shown in the figures, the semiconductor unit may also be a metal-oxide-semiconductor field-effect transistor (MOSFET). When the semiconductor unit is a MOSFET, the electronic device 100A can be provided without the detection circuit 5.

The light-emitting unit 2 is mounted on (a center portion of) the substrate 1, and is electrically coupled to the substrate 1 through an electrode layer 13 of the substrate 1. The electrode layer 13 is correspondingly disposed on the first surface 11 and the second surface 12, and can be used to be electrically coupled to various components. In the present embodiment, the light-emitting unit 2 is electrically coupled to the electrode layer 13 by wire-bonding, so as to be electrically coupled to other electronic modules (e.g., a control module) through the electrode layer 13, but the present disclosure is not limited thereto.

Referring to FIG. 3 and FIG. 4, the wall 3 is disposed on the first surface 11 and surrounds a periphery of the light-emitting unit 2. The wall 3 in the present embodiment includes two exterior wall components 31 and two interior wall components 32. The two exterior wall components 31 can be electrically coupled to the electrode layer 13 of the substrate 1, and the two interior wall components 32 are arranged in an inner side of the two exterior wall components 31.

Figure 5:
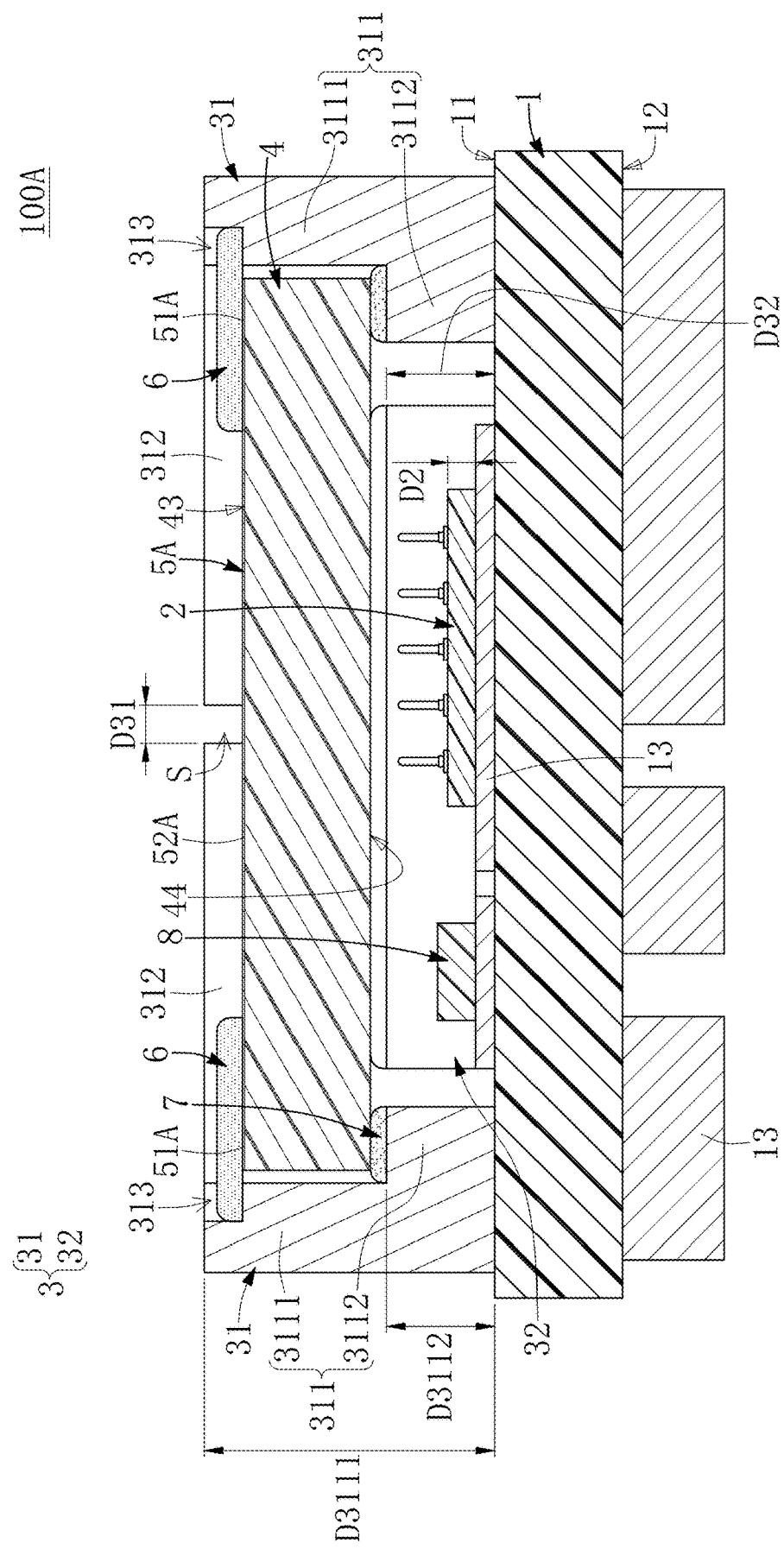
FIG. 5 is a cross-sectional view taken along line V-V of FIG. 1.

Referring to FIG. 4 and FIG. 5, specifically, each of the two exterior wall components 31 in the present embodiment is an electrically conductive structure in a U-shape. The two exterior wall components 31 are disposed on the first surface 11 and spaced apart from each other, so that an area surrounded by the two exterior wall components 31 is defined as an installation area CH. Preferably, the two exterior wall components 31 are made of metal material, so as to have an electrically conductive function and can be electrically coupled to the detection circuit 5. Naturally, in certain embodiments of the present disclosure not shown in the figures, the two exterior wall components 31 and the substrate 1 may be integrally formed as a single one-piece structure. In other words, each of the two exterior wall components 31 is made of ceramic material, and is covered by an electrically conductive layer (e.g., metal layer) on a surface thereof.

It is worth noting that, when the two exterior wall components 31 are made of metal material or covered by a metal layer on the surface thereof, the two exterior wall components 31 can not only be used as electrical conductors for electrically coupling the detection circuit 5, but also effectively prevent a plurality of electronic components disposed in the installation area CH from affected by electromagnetic interference (EMI).

In addition, when the two exterior wall components 31 are disposed on the first surface 11 and spaced apart from each other, two gaps S are formed between the two exterior wall components 31 and in spatial communication with the installation area CH. In other words, the two gaps S in the present embodiment are used as air escaping holes that are in spatial communication with the inner side and an outer side of each of the two exterior wall components 31, so as to allow gas to circulate in the installation area CH.

Preferably, a minimum separation distance D31 between the two exterior wall components 31 is preferably greater than or equal to 0.05 mm. Accordingly, when the two exterior wall components 31 are used as positive and negative electrode conductors, a short circuit does not easily occur between the two exterior wall components 31. Moreover, since the minimum separation distance D31 between the two exterior wall components 31 is greater than or equal to 0.05 mm, a minimum width of each of the two gaps S is preferably within a range from 0.05 mm to 2 mm. Accordingly, when the two gaps S are used in cooperation with the two interior wall components 32, the two interior wall components 32 can effectively prevent moisture and pollutants from entering the installation area CH.

Figure 6:
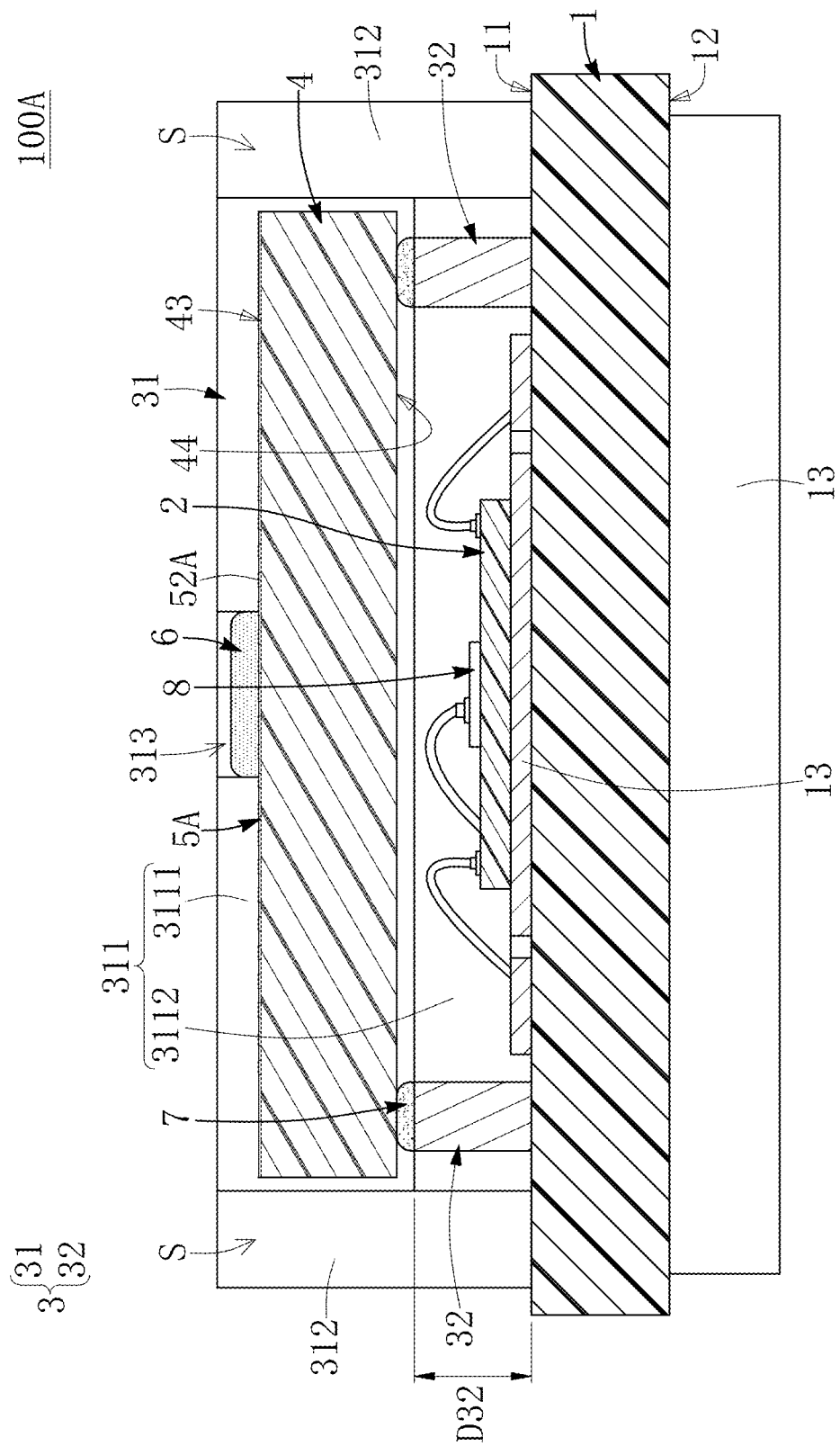
FIG. 6 is a cross-sectional view taken along line VI-VI of FIG. 1.

Referring to FIG. 3, FIG. 5, and FIG. 6, in the present embodiment, a part of each of the two exterior wall components 31 is in a stepped shape, and the position of the part of each of the two exterior wall components 31 is located on a side of each of the two exterior wall components 31 that does not provide any one of the two gaps S, such that the light-transmitting member 4 is supported.

In detail, each of the two exterior wall components 31 has a first portion 311 in a stepped shape, two second portions 312 connected to the first portion 311, and a groove 313 that is disposed on the first portion 311, so that each of the two exterior wall components 31 is substantially in a U-shape. The first portion 311 of each of the two exterior wall components 31 includes a first step 3111 and a second step 3112 that is connected to the first step 3111, the first step 3111 has the groove 313 formed thereon for receiving a part of the electrically conductive agent 6, and the second step 3112 is located in an inner side of the first step 3111. A shortest distance D3112 between a top surface of the second step 3112 and the substrate 1 is less than a shortest distance D3111 between a top surface of the first step 3111 and the substrate 1, and is greater than a shortest distance D2 between a top surface of the light-emitting unit 2 and the substrate 1.

In other words, in each of the two exterior wall components 31, a height of the first step 3111 relative to the substrate 1 is greater than a height of the second step 3112 relative to the substrate 1, and a height of the top surface of the second step 3112 relative to the substrate 1 is greater than a height of the light-emitting unit 2 (or the semiconductor unit) relative to the substrate 1. Accordingly, the light-transmitting member 4 can be supported by two of the second steps 3112 without contacting the light-emitting unit 2, so as to control a light mixing height of the light-transmitting member 4 relative to the light-emitting unit 2, but the present disclosure is not limited thereto.

For example, in certain embodiments of the present disclosure not shown in the figures, the first portion 311 and the two second portions 312 of each of the two exterior wall components 31 can also have the above-mentioned first step and second step at a same time (that is, the entirety of each of the two exterior wall components 31 is in a stepped shape), or each of the two second portions 312 is in a stepped shape and has the above-mentioned first step and second step (that is, only the two second portions 312 of the two exterior wall components 31 are in a stepped shape).

Reference is further made to FIG. 4 to FIG. 6, and each of the two interior wall components 32 in the present embodiment is a rectangular structure (e.g., a cuboid). The two interior wall components 32 are arranged in the installation area CH and spaced apart from each other. Furthermore, the two interior wall components 32 are located in the installation area CH and correspond in position to the two gaps S. The two interior wall components 32 are adjacent to and do not contact (the two second portions 312 of) the two exterior wall components 31, so that the two interior wall components 32 respectively shade parts of the two gaps S. Accordingly, the two exterior wall components 31 and the two interior wall components 32 jointly define a gas channel that is tortuous and in spatial communication with the installation area CH through the two gaps S that are an inlet and an outlet.

Referring to FIG. 5 and FIG. 6, in the present embodiment, the two interior wall components 32 and the two exterior wall components 31 can jointly support the light-transmitting member 4. Specifically, a shortest distance D32 between a top surface of each of the two interior wall components 32 and the substrate 1 is substantially equal to the shortest distance D3112 between the top surface of each of the two second steps 3112 and the substrate 1. That is to say, a height of each of the two interior wall components 32 relative to the substrate 1 is the same as the height of each of the two second steps 3112 relative to the substrate 1, so that the two interior wall components 32 and the two exterior wall components 31 can stably support the light-transmitting member 4, but the present disclosure is not limited thereto. For example, in certain embodiments of the present disclosure not shown in the figures, the two interior wall components 32 may not contact the light-transmitting member 4, that is, the light-transmitting member 4 is only supported by the two exterior wall components 31.

It should be emphasized that, in order to ensure that the light-transmitting member 4 is not misaligned or dropped when being supported by the two second steps 3112, the electronic device 100A can further include an adhesive agent 7 (e.g., a UV curable resin) that is correspondingly disposed on the top surfaces of the two second steps 3112 and the top surfaces of the two interior wall components 32, so as to fix the light-transmitting member 4.

In addition, the two interior wall components 32 in the present embodiment may be made of metal material or covered by a metal layer on the surface thereof, so that the two interior wall components 32 can respectively shield the two gaps S from electromagnetic interference occurred on the positions of the two gaps S, but the present disclosure is not limited thereto. For example, in certain embodiments of the present disclosure not shown in the figures, each of the two interior wall components 32 can also be adjusted to be made of insulating material or covered by an insulating layer on the surface thereof according to practical requirements.

Referring to FIG. 3, FIG. 5, and FIG. 6, the light-transmitting member 4 is disposed on the two second steps 3112 and the two interior wall components 32, and is spaced apart from top surfaces of the two exterior wall components 31 (that is, the light-transmitting member 4 does not contact the top surfaces of two of the first steps 3111 and the two second portions 312 of the two exterior wall components 31). A central area 42 and a peripheral area 41 that surrounds the central area 42 are defined on the light-transmitting member 4 in the present embodiment, the light-emitting unit 2 is located directly below the central area 42, and the peripheral area 41 is correspondingly disposed above the wall 3.

Furthermore, the light-transmitting member 4 has an outer surface 43 and an inner surface 44 that is opposite to the outer surface 43 and faces the light-emitting unit 2 (or the semiconductor unit). A height of the outer surface 43 of the light-transmitting member 4 is lower than a height of the top surface of each of the two exterior wall components 31, but the present embodiment is not limited thereto. For example, in certain embodiments of the present disclosure not shown in the figures, the outer surface 43 of the light-transmitting member 4 can protrude from the top surfaces of the two exterior wall components 31.

In more detail, the light-transmitting member 4 in the present embodiment is a transparent glass plate, but the present embodiment is not limited thereto. For example, in certain embodiments of the present disclosure not shown in the figures, the light-transmitting member 4 can include a transparent glass plate and a light-diffusing polymer. The inner surface 44 of the light-transmitting member 4 in the peripheral area 41 can be fixed on the two exterior wall components 31 and the two interior wall components 32 through the adhesive agent 7, and supported by the top surfaces of the two second steps 3112 and the top surfaces of the two interior wall components 32.

Referring to FIG. 3, FIG. 5, and FIG. 6, the detection circuit 5 in the present embodiment is formed on the outer surface 43 of the light-transmitting member 4. In other words, the detection circuit 5 in the present embodiment is exposed from an outer side of the electronic device 100A such that the detection circuit 5 can also be defined as an outer detection circuit 5A. The detection circuit 5 is introduced as the external detection circuit 5A in the following description.

The external detection circuit 5A in the present embodiment is located in the central area 42 of the light-transmitting member 4, and is preferably transparent (e.g., an electrically conductive film that is transparent, or an indium tin oxide). The external detection circuit 5A includes two junctions 51A and a detection wire 52A that is connected to the two junctions 51A. The detection wire 52A of the external detection circuit 5A is formed on the outer surface 43 in the central area 42 and corresponds in position to the installation area CH. That is to say, a region defined by an orthogonal projection of the detection wire 52A on the substrate 1 is located in the installation area CH, and the detection wire 52A can be used to detect whether or not the light-transmitting member 4 is damaged. Since mariners in which the detection wire 52A detects the light-transmitting member 4 are known to a person skilled in the art (e.g., by using resistance change for detection) and are not the focus of the present disclosure, details thereof will not be described herein.

In addition, the two junctions 51A of the external detection circuit 5A are separately located on two sides of the light-transmitting member 4 and correspond in position to the grooves 313 of the two exterior wall components 31. Furthermore, the grooves 313 of the two exterior wall components 31 can be used to receive the part of the electrically conductive agent 6, and another part of the electrically conductive agent 6 overflows on the two junctions 51A, so that the electrically conductive agent 6 can ensure an electrical relationship between the two exterior wall components 31 and the outer detection circuit 5A and can also be used for fixing the light-transmitting member 4.

It should be noted that, in certain embodiments of the present disclosure not shown in the figures, the two grooves 313 respectively located on the two first steps 3111 can be appropriately omitted. That is to say, the electrically conductive agent 6 is directly arranged on the top surfaces of the two first steps 3111 and the two junctions 51A.

In addition, when the outer detection circuit 5A is electrically coupled to the two exterior wall components 31, the two junctions 51A can be electrically coupled to the electrode layer 13 of the substrate 1 by using the first steps 3111 of the two exterior wall components 31 as electrode conductors, so that the outer detection circuit 5A can be further electrically coupled to other components (e.g., the light-emitting unit 2, or an electronic module, etc.), but the present disclosure is not limited thereto.

For example, in certain embodiments of the present disclosure not shown in the figures, when (the two junctions 51A of) the outer detection circuit 5A can maintain contact with the two first steps 3111 and be electrically coupled to the substrate 1, the electrically conductive agent 6 and the two grooves 313 that are located on the two first steps 3111 can also be omitted in the electronic device 100A.

In addition, in a preferred embodiment, the electronic device 100A can further include a detection unit 8 mounted on the first surface 11 of the substrate 1 (as shown in FIG. 3), and the detection unit 8 can be electrically coupled to other components through (the electrode layer 13 of) the substrate 1 for detecting whether or not the light-transmitting member 4 is damaged. It should be noted that, since the mariners in which the detection unit 8 detects whether or not the light-transmitting member 4 is damaged can be implemented by sensing the amount of change in light or other means, and are not the focus of the present disclosure, details thereof will not be described herein.

Second Embodiment

Referring to FIG. 7 to FIG. 10, a second embodiment of the present disclosure provides an electronic device 100B. The electronic device 100B of the present embodiment is similar to the electronic device 100A of the first embodiment, and the similarities between the present embodiment and the first embodiment will not be repeated herein. The difference between the present embodiment and the first embodiment mainly resides in that the light-transmitting member 4 is supported by the two second steps 3112, and the detection circuit 5 in the present embodiment is an inner detection circuit 5B that can be electrically coupled to the substrate 1 through the two interior wall components 32.

Figure 7:
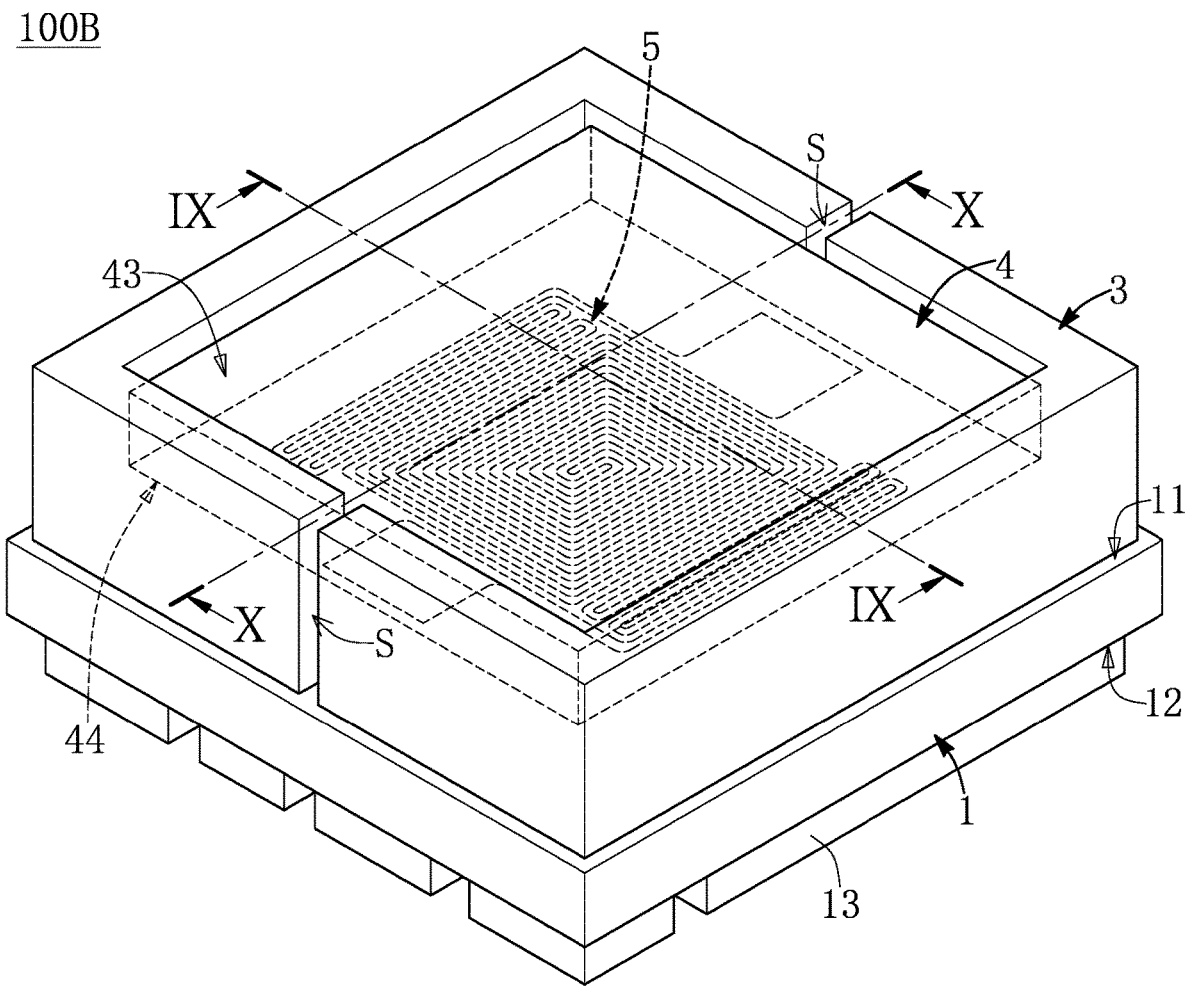
FIG. 7 is a schematic perspective view of the electronic device according to a second embodiment of the present disclosure.
Figure 8:
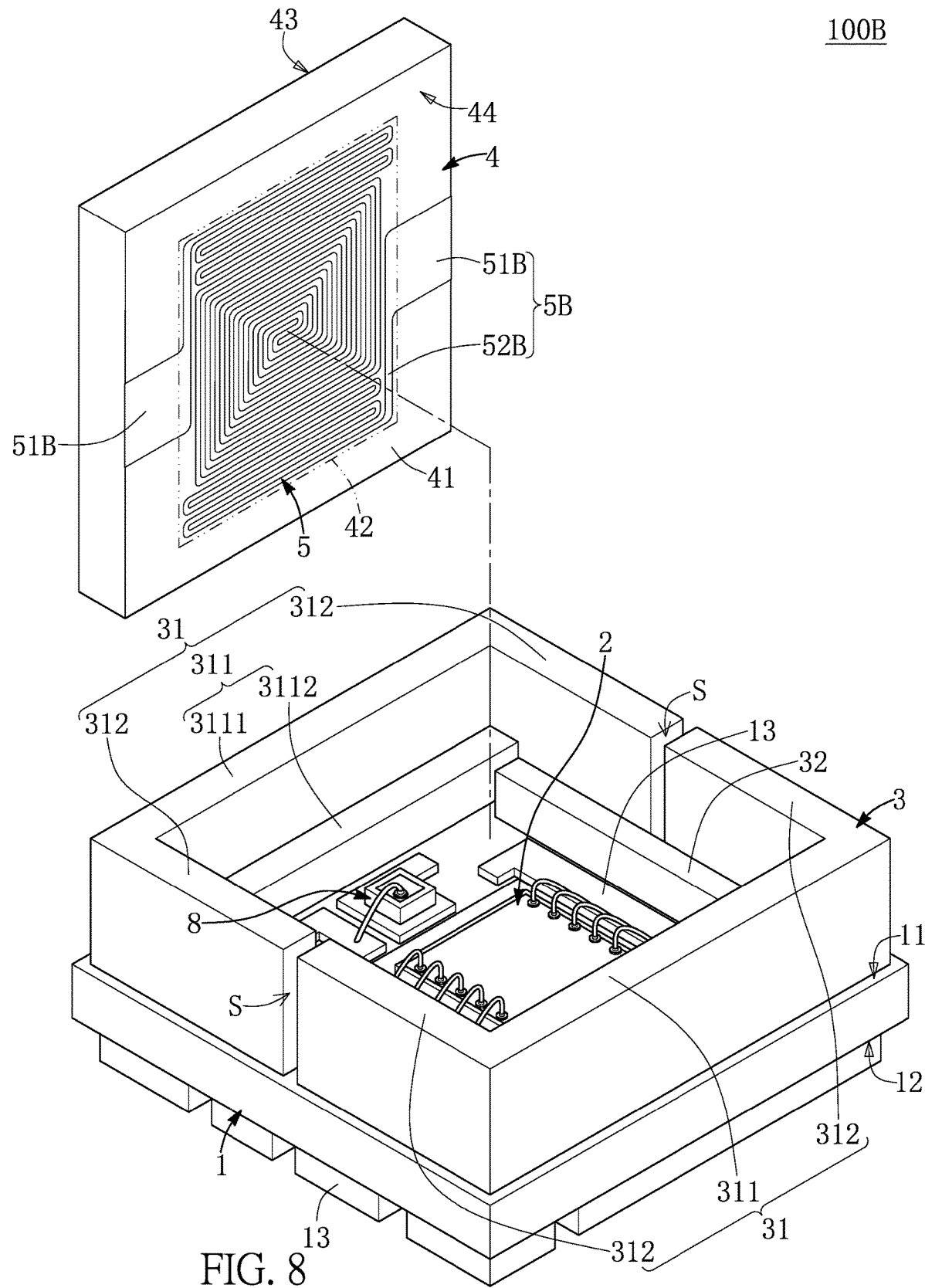
FIG. 8 is a schematic exploded view of the electronic device according to the second embodiment of the present disclosure.

Referring to FIG. 7 and FIG. 8, specifically, the detection circuit 5 in the present embodiment is formed on the inner surface 44 of the light-transmitting member 4. That is to say, the detection circuit 5 is located inside the electronic device 100B, so that the detection circuit 5 can also be defined as the inner detection circuit 5B. The inner detection circuit 5B includes two junctions 51B and a detection wire 52B that is electrically coupled to the two junctions 51B. The two junctions 51B are separately located on two sides of the light-transmitting member 4 that are adjacent to the two interior wall components 32. The detection wire 52B is located on the inner surface 44 of the light-transmitting member 4 in the central area 42.

Figure 9:
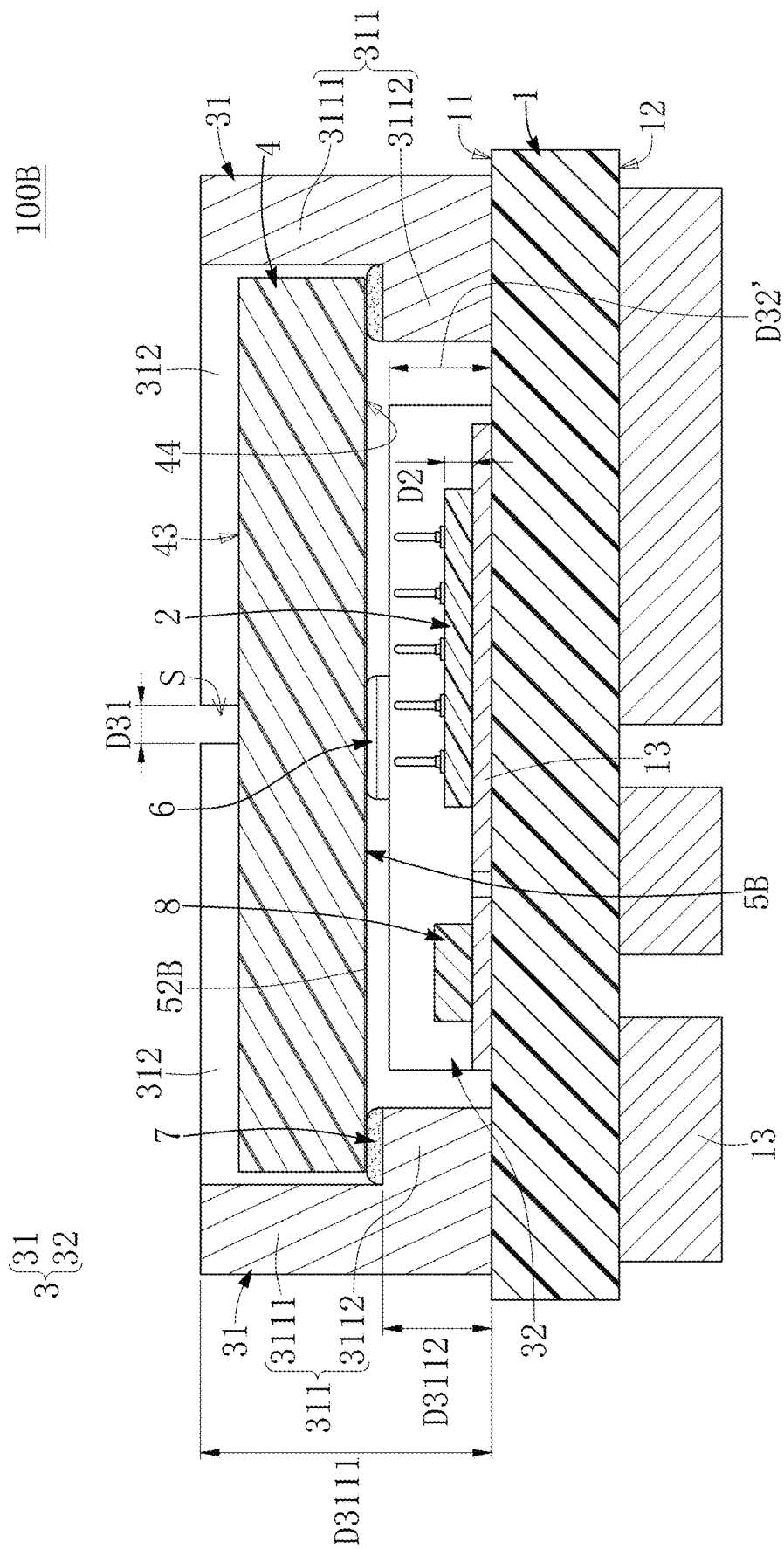
FIG. 9 is a cross-sectional view taken along line IX-IX of FIG. 7.
Figure 10:
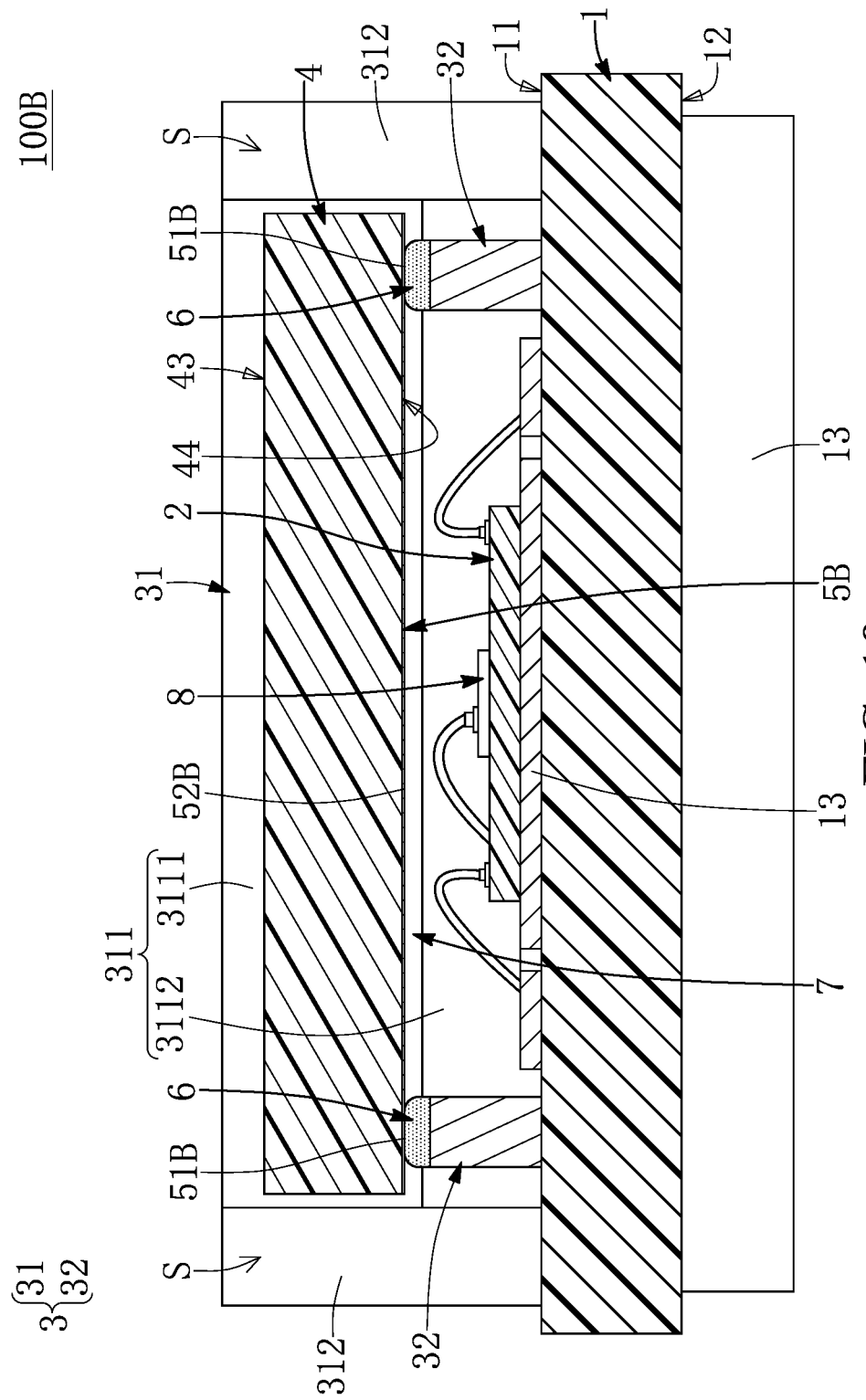
FIG. 10 is a cross-sectional view taken along line X-X of FIG. 7.

Referring to FIG. 9 and FIG. 10, the two interior wall components 32 in the present embodiment are used as electrode conductors of the inner detection circuit 5B, such that the two interior wall components 32 are limited to be made of metal material or covered by a metal layer on the surface thereof.

Furthermore, in the present embodiment, a shortest distance D32' between the top surface of each of the two interior wall components 32 and the substrate 1 is substantially less than the shortest distance D3112 between the top surface of each of the two second steps 3112 and the substrate 1. That is to say, the height of each of the two interior wall components 32 relative to the substrate 1 is less than the height of each of the two second steps 3112 relative to the substrate 1, so that the light-transmitting member 4 in the present embodiment is only supported by the two second steps 3112.

Referring to FIG. 9 and FIG. 10, the electrically conductive agent 6 is correspondingly arranged on the top surfaces of the two interior wall components 32, and a thickness of the electrically conductive agent 6 is the same as a height difference between the two interior wall components 32 and the two second steps 3112, so that the electrically conductive agent 6 can be used as an electrode conductor between the two interior wall components 32 and the inner detection circuit 5B.

In addition, when the inner detection circuit 5B is electrically coupled to the two interior wall components 32, the two junctions 51B can use the two interior wall components 32 as electrode conductors to be electrically coupled to the electrode layer 13 of the substrate 1 through the electrically conductive agent 6, so that the inner detection circuit 5B can be further electrically coupled to other components (e.g., the light-emitting unit 2, or an electronic module, etc.). Accordingly, the inner detection circuit 5B can have a detection function and an extended service life.

Third Embodiment

Figure 11:
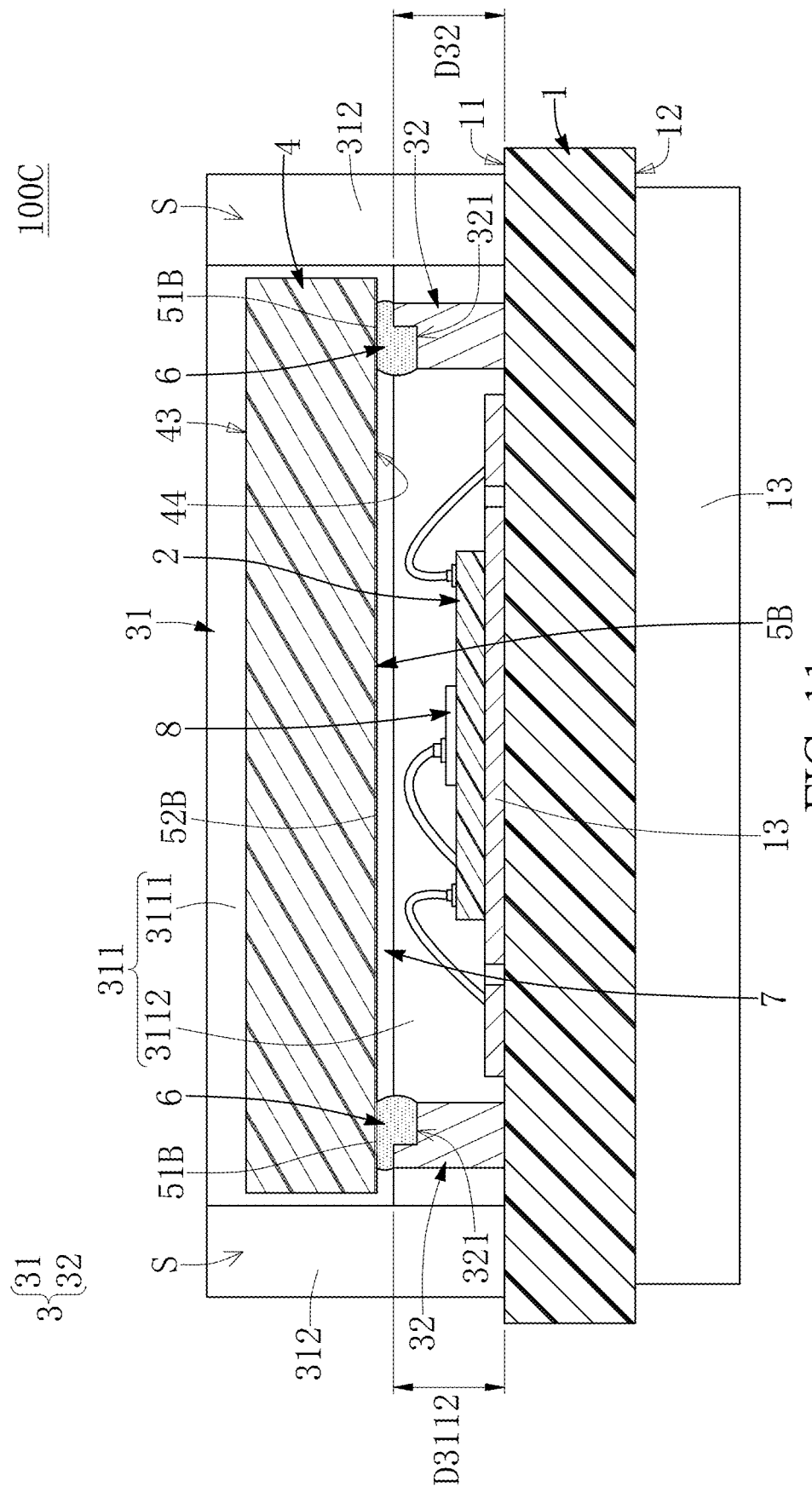
FIG. 11 is a schematic cross-sectional view of the electronic device according to a third embodiment of the present disclosure.

Referring to FIG. 11, a third embodiment of the present disclosure provides an electronic device 100C. The electronic device 100C of the present embodiment is similar to the electronic device 100B of the second embodiment, and the similarities between the present embodiment and the second embodiment will not be repeated herein. The difference between the present embodiment and the second embodiment mainly resides in that the light-transmitting member 4 is supported by the two second steps 3112 and the two interior wall components 32.

Specifically, the height of each of the two interior wall components 32 relative to the substrate 1 is equal to the height of each of the two second steps 3112 relative to the substrate 1, and the top surface of each of the two interior wall components 32 has a groove 321 formed thereon for receiving a part of the electrically conductive agent 6, and another part of the electrically conductive agent 6 overflows on the two junctions 51B, so that the electrically conductive agent 6 can ensure an electrical relationship between the two interior wall components 32 and the inner detection circuit 5B and can also be used for fixing the light-transmitting member 4 on the two interior wall components 32, but the present disclosure is not limited thereto.

For example, in certain embodiments of the present disclosure not shown in the figures, when (the two junctions 51B of) the inner detection circuit 5B can maintain contact with the two interior wall components 32 and be electrically coupled to the substrate 1, the electrically conductive agent 6 and the grooves 321 of the two interior wall components 32 can also be omitted in the electronic device 100C.

It should be noted that, the two interior wall components 32 in the present embodiment can support the light-transmitting member 4 and can serve as electrode conductors that can be electrically coupled to the inner detection circuit 5B. Therefore, in certain embodiments of the present disclosure not shown in the figures, the second steps 3112 can be provided without the first portions 311 of the two exterior wall components 31, that is, the light-transmitting member 4 is only supported by the two interior wall components 32.

Fourth Embodiment

Figure 12:
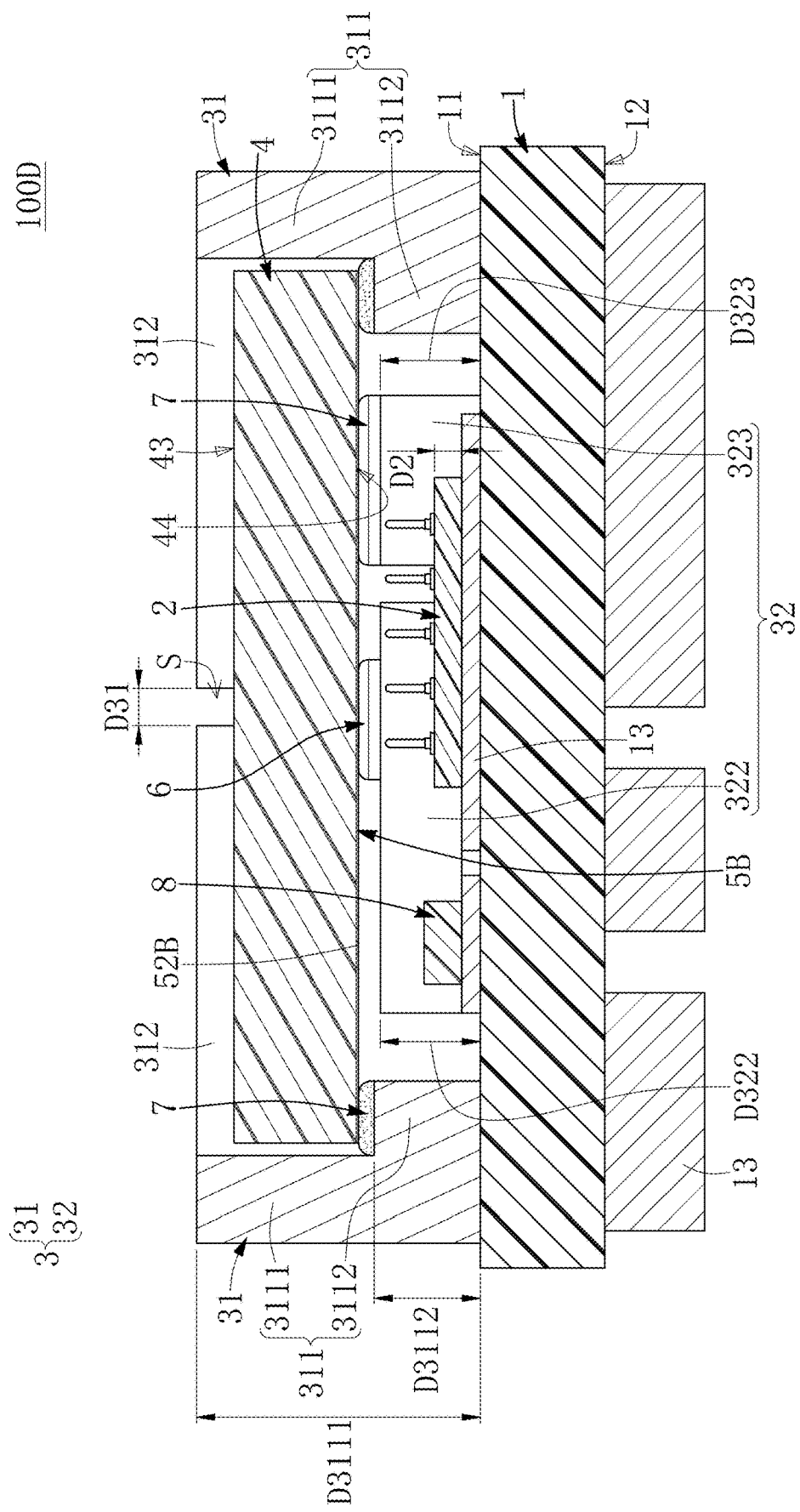
FIG. 12 is a schematic cross-sectional view of the electronic device according to a fourth embodiment of the present disclosure.
Figure 13:
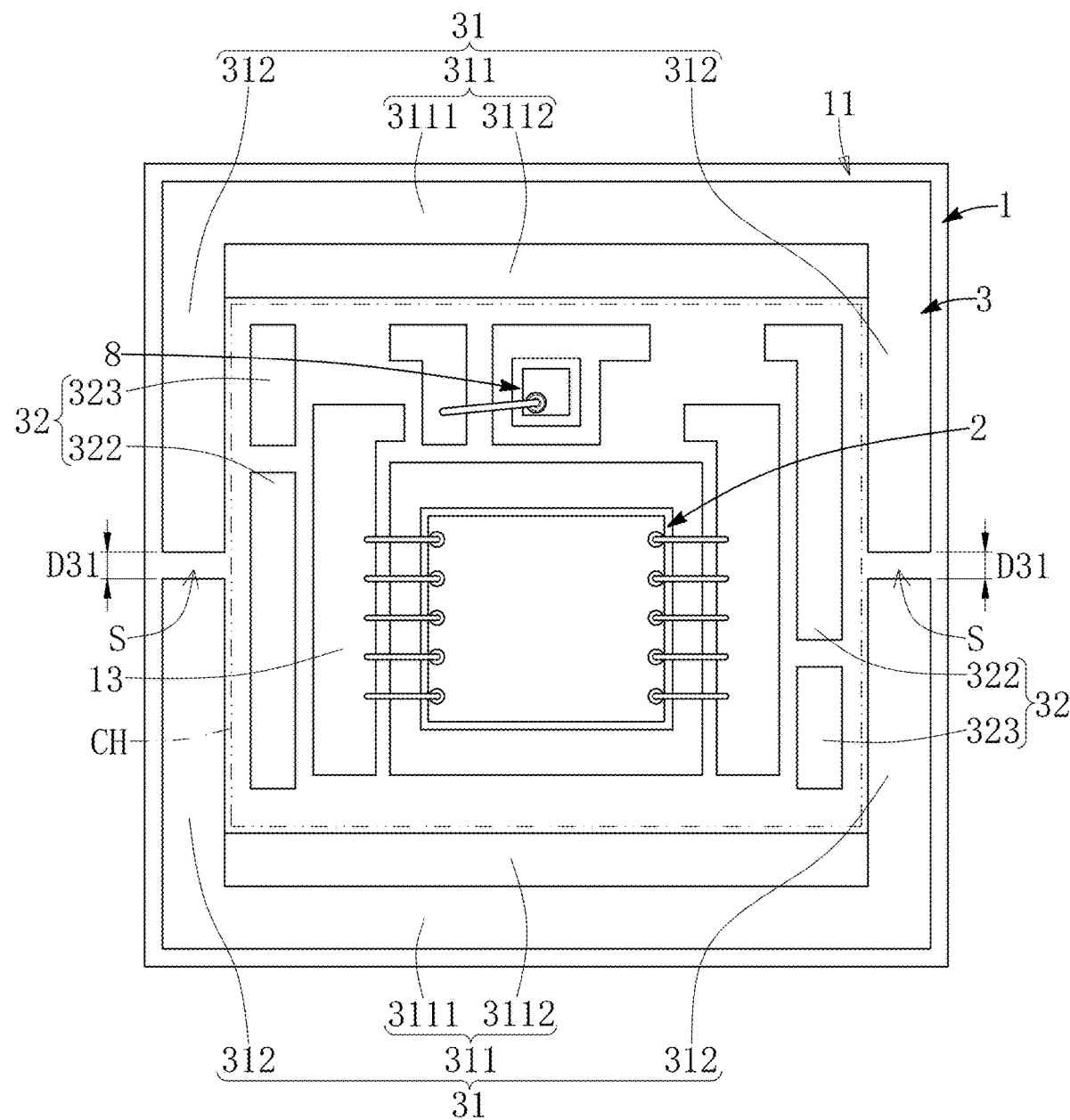
FIG. 13 is a top view of the electronic device provided without a light-transmitting member and an inner detection circuit according to the fourth embodiment of the present disclosure.

Referring to FIG. 12 and FIG. 13, a fourth embodiment of the present disclosure provides an electronic device 100D. The electronic device 100D of the present embodiment is similar to the electronic device 100B of the second embodiment, and the similarities between the present embodiment and the second embodiment will not be repeated herein. The difference between the present embodiment and the second embodiment mainly resides in that each of the two interior wall components 32 in the present embodiment further includes an electrically conductive portion 322 and an insulating portion 323.

Referring to FIG. 12 and FIG. 13, specifically, the electrically conductive portion 322 and the insulating portion 323 of each of the two interior wall components 32 in the present embodiment are arranged in the installation area CH and spaced apart from each other. The electrically conductive portions 322 of the two interior wall components 32 correspond in position to the two gaps S, so as to respectively shade the parts of the two gaps. Naturally, any one of the electrically conductive portion 322 and the insulating portion 323 of each of the two interior wall components 32 may correspond in position to one of the two gaps S.

In addition, in each of the two interior wall components 32, the electrically conductive portion 322 is made of metal material or covered by a metal layer on the surface thereof, so that the inner detection circuit 5B can be electrically coupled to the substrate 1 through the electrically conductive portion 322. The insulating portion 323 is made of insulating material or covered by an insulating layer on the surface thereof, so that the insulating portion 323 is not electrically coupled to the inner detection circuit 5B, and can be used in cooperation with the electrically conductive portion 322 to form the gas channel.

It should be emphasized that, in each of the two interior wall components 32, a shortest distance D322 between a top surface of the electrically conductive portion 322 and the substrate 1 is substantially equal to a shortest distance D323 between a top surface of the insulating portion 323 and the substrate 1, and is less than the shortest distance D3112 between the top surface of the second step 3112 and the substrate 1. In other words, a height of the electrically conductive portion 322 of each of the two interior wall components 32 relative to the substrate 1 is equal to a height of the insulating portion 323 of each of the two interior wall components 32, and is less than the height of each of the two second steps 3112, so that the light-transmitting member 4 can only be supported by the second steps 3112 of the two exterior wall components 31, but the present disclosure is not limited thereto.

For example, in certain embodiments of the present disclosure not shown in the figures, the heights of the electrically conductive portion 322 and the insulating portion 323 of each of the two interior wall components 32 relative to the substrate 1 may be different from each other, but the heights of the electrically conductive portion 322 and the insulating portion 323 of each of the two interior wall components 32 in principle must not affect the two second steps 3112 to support the light-transmitting member 4, that is, the heights of the electrically conductive portion 322 and the insulating portion 323 of each of the two interior wall components 32 need to be less than the height of each of the two second steps 3112.

In addition, in certain embodiments of the present disclosure not shown in the figures, the electrically conductive portions 322 of the two interior wall components 32 each have the groove 321 that can receive a part of the electrically conductive agent 6, and another part of the electrically conductive agent 6 overflows on the two junctions 51B of the inner detection circuit 5B, so that the electrically conductive agent 6 can be used for the inner detection circuit 5B to be electrically coupled to the substrate 1 through two of the electrically conductive portions 322. In other words, the thickness of the electrically conductive agent 6 is the same as a height difference between the two electrically conductive portions 322 and the two second steps 3112.

Fifth Embodiment

Figure 14:
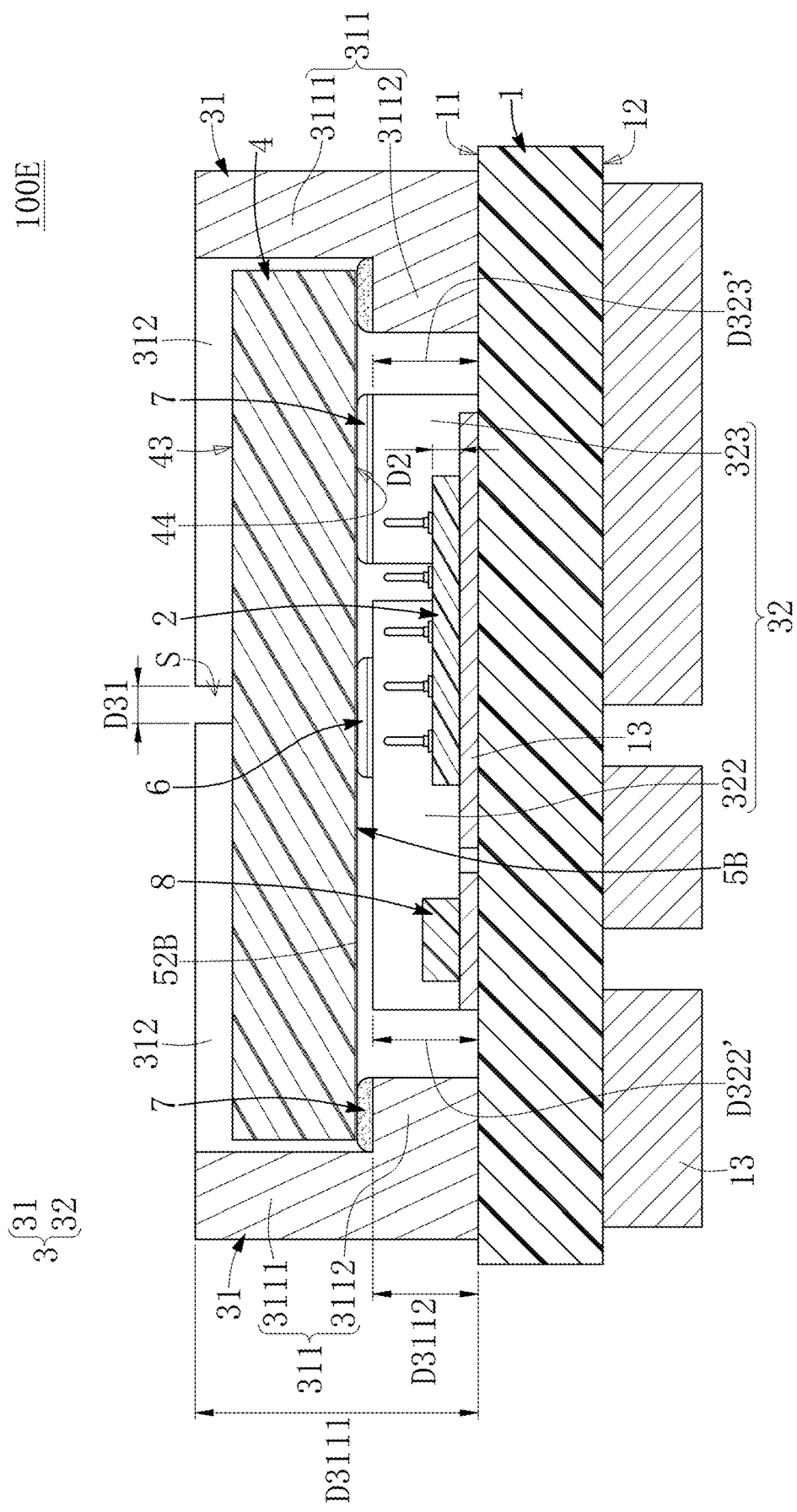
FIG. 14 is a schematic cross-sectional view of the electronic device according to a fifth embodiment of the present disclosure.

Referring to FIG. 14, a fifth embodiment of the present disclosure provides an electronic device 100E. The electronic device 100E of the present embodiment is similar to the electronic device 100D of the fourth embodiment and the similarities between the present embodiment and the fourth embodiment will not be repeated herein. The difference between the present embodiment and the fourth embodiment mainly resides in that the light-transmitting member 4 is supported by the two second steps 3112, and the electrically conductive portions 322 and the insulating portions 323 of the two interior wall components 32.

Specifically, in each of the two interior wall components 32, a shortest distance D322' between the top surface of the electrically conductive portion 322 and the substrate 1 is substantially equal to a shortest distance D323' between the top surface of the insulating portion 323 and the substrate 1, and is also substantially equal to the shortest distance D3112 between the top surface of each of the two second steps 3112 and the substrate 1. In other words, the heights of the electrically conductive portion 322 and the insulating portion 323 of each of the two interior wall components 32 and the two second steps 3112 relative to the substrate 1 are equal to each other, so that the light-transmitting member 4 can be supported by the electrically conductive portions 322 and the insulating portions 323 of the two interior wall components 32 and the two second steps 3112.

In addition, the electrically conductive portions 322 of the two interior wall components 32 can have the electrically conductive agent 6 disposed thereon, so that the electrically conductive agent 6 can ensure that the electrically conductive portions 322 of the two interior wall components 32 can be electrically coupled to the inner detection circuit 5B. Naturally, when the electrically conductive portions 322 of the two interior wall components 32 can maintain contact with (the two junctions 51A of) the inner detection circuit 5B, the electrically conductive agent 6 may be omitted in the electronic device 100E.

Furthermore, the insulating portions 323 of the two interior wall components 32 can have the adhesive agent 7 disposed thereon, so that the adhesive agent 7 can fix the light-transmitting member 4 on the two interior wall components 32. Naturally, the adhesive agent 7 can also be omitted according to practical requirements.

It should be noted that the electrically conductive portions 322 and the insulating portions 323 of the two interior wall components 32 in the present embodiment can support the light-transmitting member 4, and are used as the electrode conductors of the inner detection circuit 5B. Therefore, in certain embodiments of the present disclosure not shown in the figures, the second step 3112 can be provided without the first portion 311 of each of the two exterior wall components 31. That is to say, the light-transmitting member 4 is only supported by the electrically conductive portions 322 and the insulating portions 323 of the two interior wall components 32.

Sixth Embodiment

Figure 15:
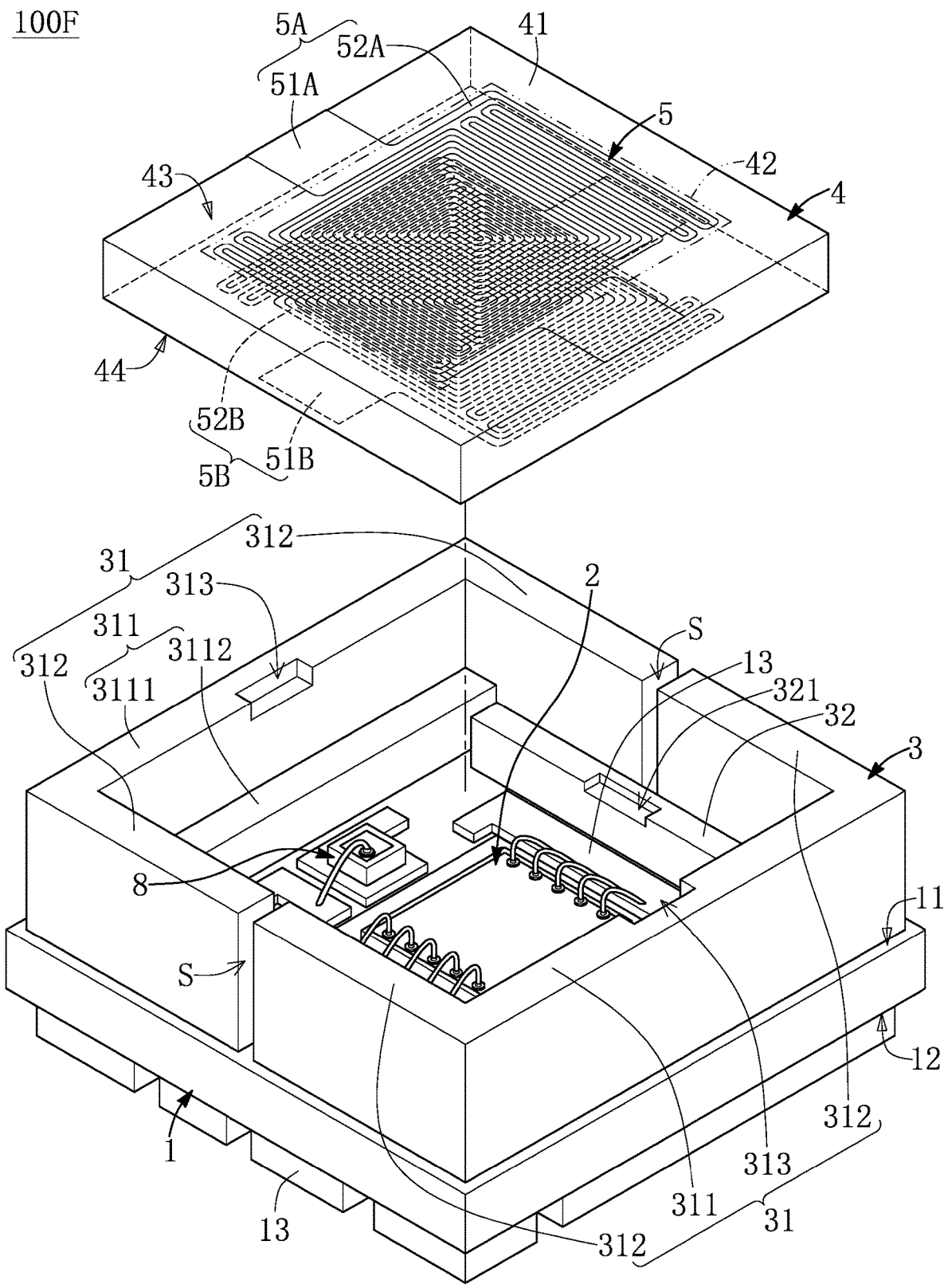
FIG. 15 is a schematic exploded view of the electronic device according to a sixth embodiment of the present disclosure.
Figure 16:
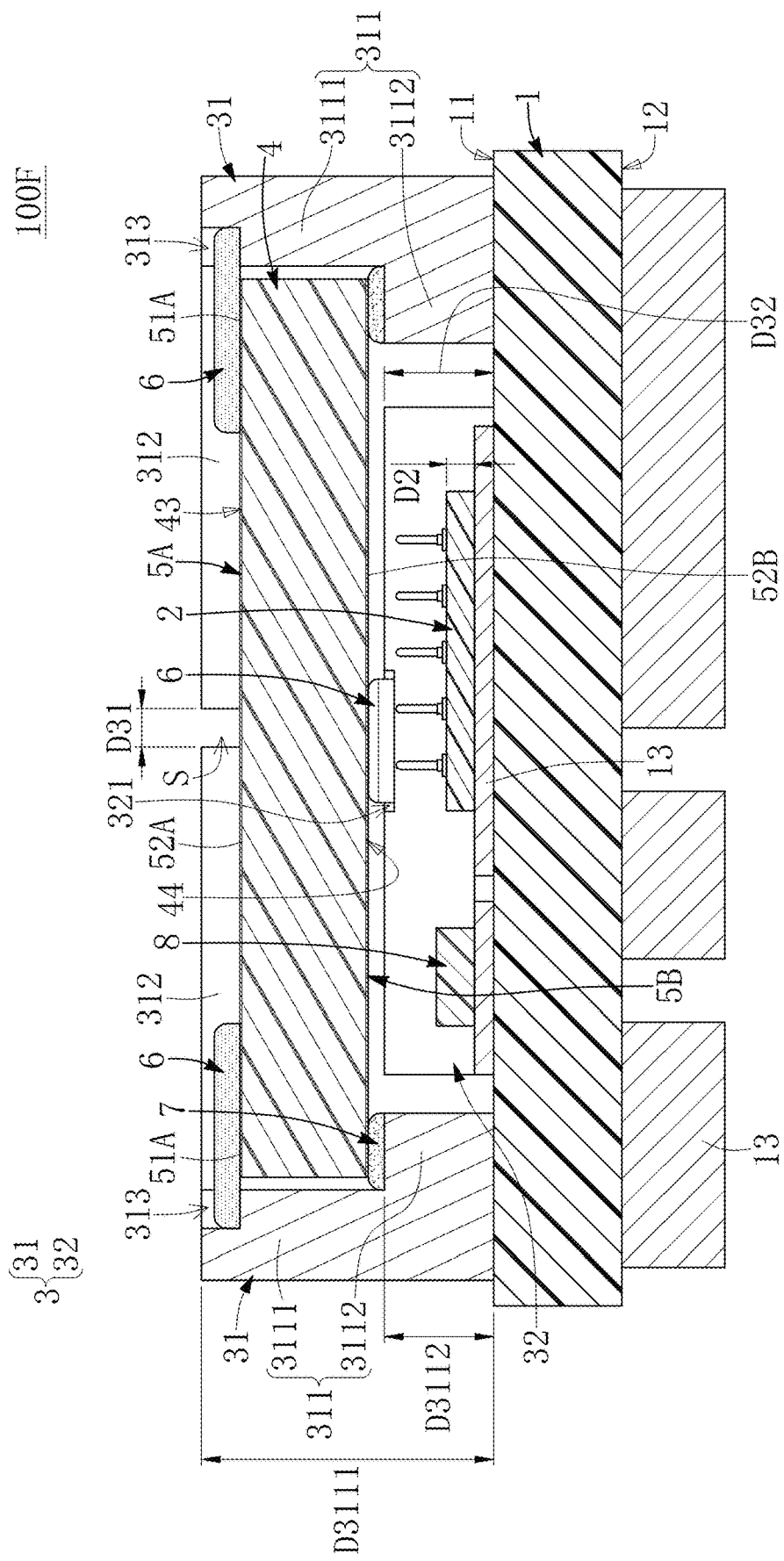
FIG. 16 is a schematic cross-sectional view of the electronic device according to the sixth embodiment of the present disclosure.

Referring to FIG. 15 and FIG. 16, a sixth embodiment of the present disclosure provides an electronic device 100F. The electronic device 100F of the present embodiment is similar to the electronic device 100A of the first embodiment, and the similarities between the present embodiment and the first embodiment will not be repeated herein. The difference between the present embodiment and the first embodiment mainly resides in that the light-transmitting member 4 is further formed with an inner detection circuit 5B.

Specifically, the detection circuit 5 is further formed on the inner surface of the light-transmitting member 4 and located inside the electronic device 100F, so that the detection circuit 5 can also be defined as the inner detection circuit 5B. The inner detection circuit 5B includes two junctions 51B and a detection wire 52B that is connected to the two junctions 51B. The two junctions 51B are separately located on two sides of the light-transmitting member 4 adjacent to the two interior wall components 32. The two junctions 51B can be electrically coupled to the substrate 1 through the two interior wall components 32.

In other words, the outer detection circuit 5A and the inner detection circuit 5B are formed in the light-transmitting member 4 of the present embodiment at a same time, the outer detection circuit 5A can be electrically coupled to the substrate 1 through the two exterior wall components 31, and the inner detection circuit 5B can be electrically coupled to the substrate 1 through the two interior wall components 32. Accordingly, the user can simultaneously use, or select one of the outer detection circuit 5A and the inner detection circuit 5B to use.

It should be noted that, according to quantities of the detection circuits in the present embodiment and the first embodiment, a quantity of the detection circuits of the electronic device is at least one, and a quantity of the detection circuits 5 can be adjusted according to practical requirements. Therefore, the electronic device of the present disclosure may include at least one detection circuit.

Beneficial Effects of the Embodiments

In conclusion, in the electronic device provided by the present disclosure, by virtue of "the two gaps being in spatial communication with the installation area that is surrounded by the two exterior wall components" and "the two interior wall components corresponding in position to the two gaps and respectively shading the parts of the two gaps", the electronic device can be ensured to be in an unsealed state and have an effect of blocking pollution.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electronic device, comprising:
   a substrate;
   a semiconductor unit mounted on the substrate;
   a wall disposed on the substrate and surrounding the semiconductor unit, wherein the wall includes:
      two exterior wall components, wherein the two exterior wall components are spaced apart from each other, so that two gaps are formed between the two exterior wall components, and wherein the two gaps are in spatial communication with an installation area that is surrounded by the two exterior wall components; and
      two interior wall components arranged in the installation area and spaced apart from each other, wherein the two interior wall components correspond in position to the two gaps and respectively shade parts of the two gaps; and
   a light-transmitting member disposed on the wall and covered on the semiconductor unit.

2. The electronic device according to claim 1, wherein the semiconductor unit is a light-emitting unit.

3. The electronic device according to claim 2, wherein the light-emitting unit is a vertical-cavity surface-emitting laser.

4. The electronic device according to claim 1, wherein the light-transmitting member is supported by the two interior wall components.

5. The electronic device according to claim 4, wherein each of the two interior wall components is made of metal material or covered by a metal layer on a surface thereof.

6. The electronic device according to claim 5, wherein the light-transmitting member includes an inner detection circuit electrically coupled to the two interior wall components.

7. The electronic device according to claim 6, wherein each of the two exterior wall components is made of metal material or covered by a metal layer on a surface thereof.

8. The electronic device according to claim 4, wherein a part of each of the two exterior wall components is in a stepped shape, and includes:
   a first step; and
   a second step located on an inner side of the first step, wherein a shortest distance between a top surface of the second step and the substrate is less than a shortest distance between a top surface of the first step and the substrate.

9. The electronic device according to claim 8, wherein the light-transmitting member is supported by the second steps of the two interior wall components at a same time.

10. The electronic device according to claim 9, wherein the light-transmitting member includes an outer detection circuit electrically coupled to the two exterior wall components.

11. The electronic device according to claim 10, wherein the outer detection circuit is electrically coupled to the two exterior wall components by an electrically conductive agent.

12. The electronic device according to claim 11, wherein each of the two exterior wall components has a groove formed thereon for receiving a part of the electrically conductive agent.

13. The electronic device according to claim 8, further comprising an adhesive agent; wherein the adhesive agent is correspondingly disposed on the top surfaces of the two second steps and the top surfaces of the two interior wall components, so as to fix the light-transmitting member.

14. The electronic device according to claim 13, wherein the adhesive agent is a UV curable resin.

15. The electronic device according to claim 1, wherein the two interior wall components do not contact the two exterior wall components.

16. The electronic device according to claim 1, wherein each of the two gaps has a minimum width that is within a range from 0.05 mm to 2 mm.

17. The electronic device according to claim 1, further comprising a detection unit mounted on the substrate.

* * * * *